(12) United States Patent
Hori (10) Patent No.: US 11,495,667 B2
(45) Date of Patent: Nov. 8, 2022

(54) SEMICONDUCTOR DEVICE

(71) Applicant: Mitsubishi Electric Corporation, Tokyo (JP)

(72) Inventor: Yukitaka Hori, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/136,906

(22) Filed: Dec. 29, 2020

(65) Prior Publication Data

US 2021/0249514 A1  Aug. 12, 2021

(30) Foreign Application Priority Data

Feb. 6, 2020  (JP) .............................. JP2020-018782

(51) Int. Cl.
*H01L 29/40* (2006.01)
*H01L 29/861* (2006.01)
*H01L 29/06* (2006.01)

(52) U.S. Cl.
CPC ........ *H01L 29/408* (2013.01); *H01L 29/0623* (2013.01); *H01L 29/404* (2013.01); *H01L 29/861* (2013.01)

(58) Field of Classification Search
CPC . H01L 29/408; H01L 29/0623; H01L 29/404; H01L 29/861; H01L 23/291; H01L 23/3157; H01L 23/60; H01L 29/0619; H01L 29/8611; H01L 29/0692; H01L 29/417; H01L 29/868; H01L 2924/12031; H01L 2924/12036; H01L 29/66136; H01L 29/872–8725

See application file for complete search history.

(56) References Cited

U.S. PATENT DOCUMENTS

| | | | |
|---|---|---|---|
| 2002/0139991 A1 | 10/2002 | Matsuo et al. | |
| 2017/0301781 A1* | 10/2017 | Boles | H01L 29/42312 |
| 2018/0240792 A1* | 8/2018 | Senoo | H01L 27/0255 |
| 2020/0279844 A1* | 9/2020 | Brogle | H01L 27/0676 |
| 2021/0217678 A1* | 7/2021 | Hoshi | H01L 29/1095 |
| 2021/0399143 A1* | 12/2021 | Boles | H01L 29/868 |

FOREIGN PATENT DOCUMENTS

JP  2002-359377 A  12/2002

* cited by examiner

*Primary Examiner* — Shahed Ahmed
(74) *Attorney, Agent, or Firm* — Studebaker & Brackett PC (57) ABSTRACT

A semiconductor device includes a semiconductor substrate, a first anode electrode, and a second anode electrode. The first anode electrode is disposed on the semiconductor substrate. The second anode electrode is spaced from the first anode electrode on the semiconductor substrate around the first anode electrode. At least any of a first end of the first anode electrode on a second anode electrode side and a second end of the second anode electrode on a first anode electrode side is covered with a SInSiN film.

9 Claims, 7 Drawing Sheets

SEMICONDUCTOR DEVICE

BACKGROUND OF THE INVENTION

Field of the Invention

The present disclosure relates to semiconductor devices.

Description of the Background Art

For example, Japanese Patent Laying-Open No. 2002-359377 discloses a semiconductor device. The semiconductor device includes an anode electrode on a first main surface of a semiconductor substrate and a cathode electrode on a second main surface of the semiconductor substrate. The anode electrode includes a first anode electrode and a second anode electrode. The first anode electrode is formed at a central portion on the first main surface of the semiconductor substrate. The second anode electrode is spaced from the first anode electrode on the first main surface outside the first anode electrode. Each of the first anode electrode and the second anode electrode is a current-carrying portion of the semiconductor device. Note that the first anode electrode is formed in an active region of the semiconductor device, whereas the second anode electrode is formed as a monitoring electrode outside the first anode electrode. The monitoring electrode is formed to check the current-carrying properties of the semiconductor device.

SUMMARY OF THE INVENTION

In the semiconductor device disclosed in Japanese Patent Laying-Open No. 2002-359377, however, an electric discharge may occur between the first anode electrode and the second anode electrode.

The present disclosure has been made in view of the above problem. An object of the present disclosure is to provide a semiconductor device capable of restraining an electric discharge between a first anode electrode and a second anode electrode outside the first anode electrode.

A semiconductor device according to the present disclosure includes a semiconductor substrate, a first anode electrode, and a second anode electrode. The first anode electrode is disposed on the semiconductor substrate. The second anode electrode is spaced from the first anode electrode on the semiconductor substrate around the first anode electrode. At least any of a first end of the first anode electrode on a second anode electrode side and a second end of the second anode electrode on a first anode electrode side is covered with a semi-insulated silicon nitride (SInSiN) film.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

The present embodiment will now be described with reference to the drawings.

Embodiment 1

Figure 1:
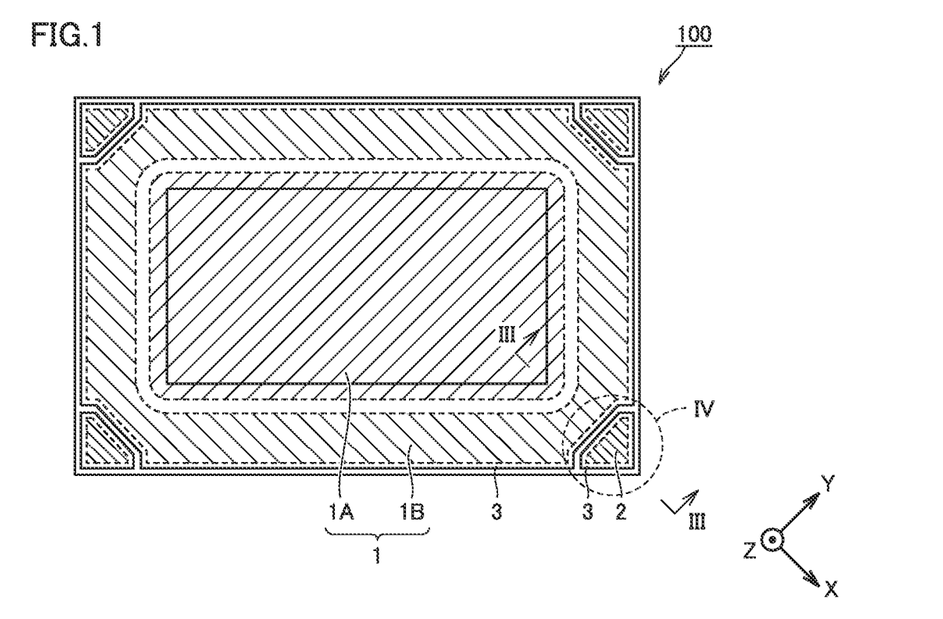
FIG. 1 is a schematic top view of a semiconductor device of a first example of Embodiment 1.
Figure 2:
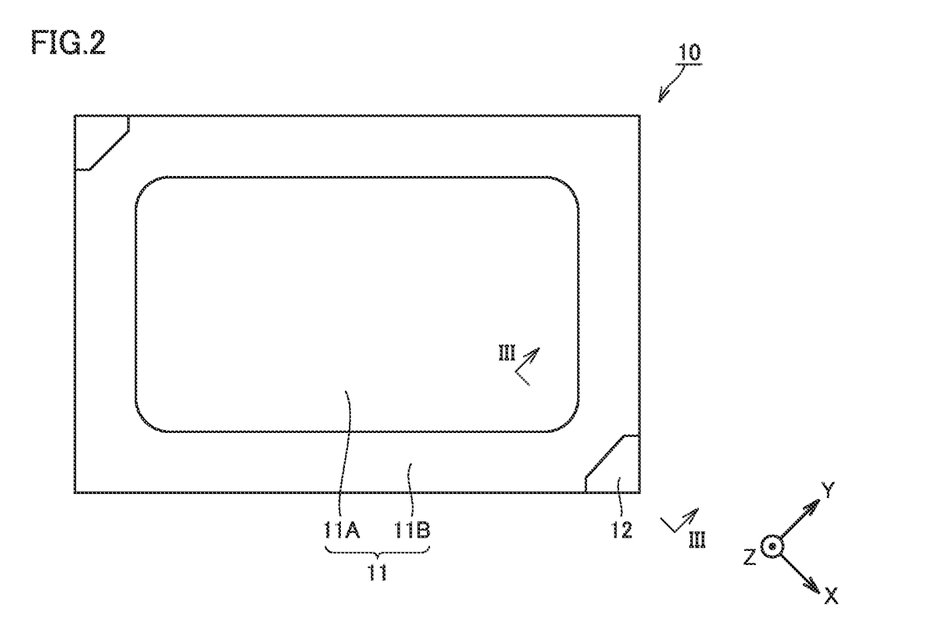
FIG. 2 is a schematic top view of a portion of a semiconductor substrate which is included in the semiconductor device of the first example of Embodiment 1.
Figure 3:
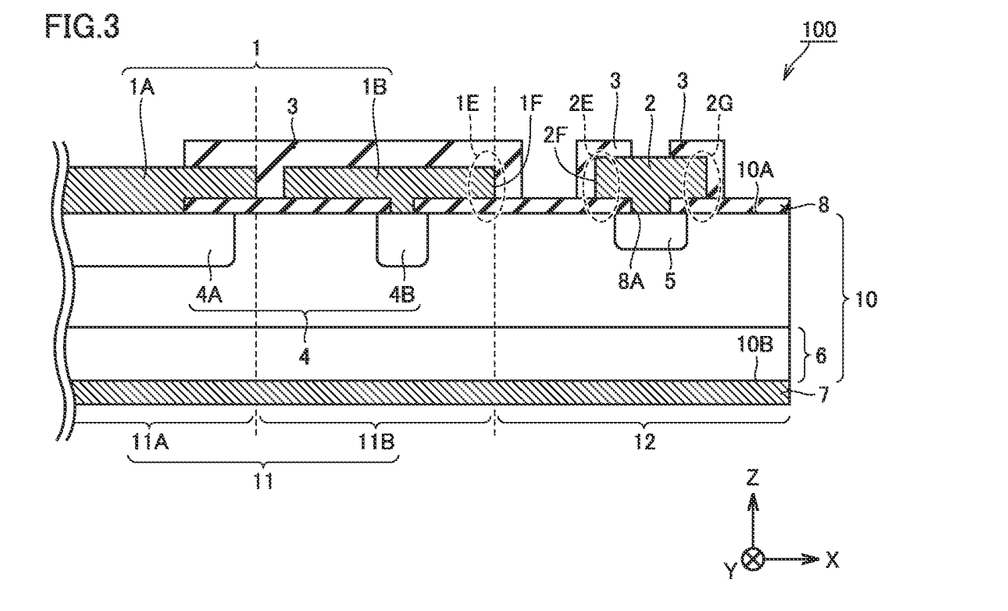
FIG. 3 is a schematic sectional view of the semiconductor device of the first example of Embodiment 1 at a portion which is taken along the line III-III in FIGS. 1 and 2.

First, a configuration of a semiconductor device of the present embodiment will be described with reference to FIGS. 1 to 4. For the sake of convenience of description, an X direction, a Y direction, and a Z direction are introduced. FIG. 1 is a schematic top view of a semiconductor device of a first example of Embodiment 1. FIG. 2 is a schematic top view of a portion of a semiconductor substrate which is included in the semiconductor device of the first example of Embodiment 1. FIG. 3 is a schematic sectional view of the semiconductor device of the first example of Embodiment 1 at a portion which is taken along the line in FIGS. 1 and 2. Note that as shown in FIGS. 1 and 2, each of the X direction and the Y direction is inclined, for example, approximately 45° with respect to the horizontal direction and the vertical direction in each figure. The following figures may be shown in similar directions to those of FIGS. 1 and 2.

Referring to FIGS. 1, 2, and 3, a semiconductor device 100 according to the first example of the present embodiment includes a semiconductor substrate 10. Semiconductor substrate 10 has a diode formed therein. Specifically, semiconductor substrate 10 has a first main surface 10A and a second main surface 10B opposite to first main surface 10A. Semiconductor substrate 10 is made of, for example, n-type silicon. First main surface 10A is disposed on the upper side in the Z direction of each figure, and second main surface 10B is disposed on the lower side in the Z direction of each figure.

Semiconductor substrate 10 includes a diode portion 11 and a monitoring portion 12. Diode portion 11 is a region of semiconductor substrate 10 in which the diode is formed. Diode portion 11 is disposed at, for example, the central portion as first main surface 10A of semiconductor substrate 10 is seen in plan view. Diode portion 11 includes an active region 11A and a peripheral region 11B. Active region 11A is a region of diode portion 11 in which the main body of the diode is formed and a current is passed by the diode. Peripheral region 11B is a region for the main body of the diode formed in active region 11A to have a breakdown voltage of not less than a certain value. Peripheral region 11B is disposed outside active region 11A to, for example, surround active region 11A as first main surface 10A of semiconductor substrate 10 is seen in plan view.

Monitoring portion 12 is disposed outside, for example, diode portion 11 of semiconductor substrate 10 to surround, for example, diode portion 11 as first main surface 10A is seen in plan view. Monitoring portion 12 may be formed at a corner of semiconductor substrate 10 of, for example, rectangular shape seen in plan view, as shown in FIGS. 1 and 2. Alternatively, monitoring portion 12 may be formed only at an upper left corner of semiconductor substrate 10 of rectangular shape as seen in plan view and a lower right corner diagonally opposite to the upper left corner, as shown in FIG. 2. Monitoring portion 12 is a region formed to check the current-carrying properties of the diode. Note that active region 11A, peripheral region 11B, and monitoring portion 12 may be adjacent to each other to contact with each other.

Figure 4:
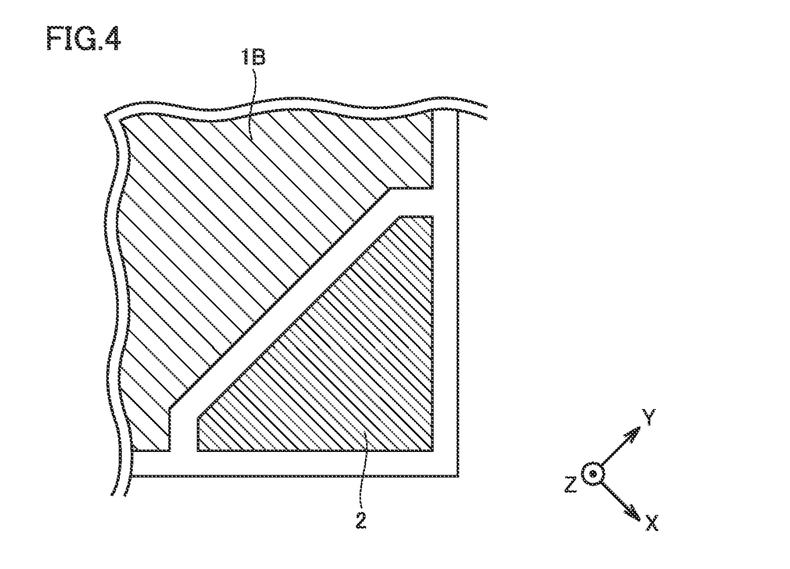
FIG. 4 is an enlarged schematic top view of a region IV surrounded by the dotted line in FIG. 1.

FIG. 4 is an enlarged schematic top view of a region IV surrounded by the dotted line in FIG. 1. Referring to FIGS. 1 to 3 and 4, diode portion 11 has a first anode electrode 1 disposed on first main surface 10A. Monitoring portion 12A has a second anode electrode 2 disposed on first main surface 10A. Second anode electrode 2 is spaced from first anode electrode 1 on first main surface 10A of semiconductor device 10 around first anode electrode 1. In other words, second anode electrode 2 is disposed outside first anode electrode 1 in plan view.

In the example of FIG. 3, first anode electrode 1 includes an active-portion electrode 1A and a peripheral electrode 1B. Active-portion electrode 1A is a first anode electrode formed in active region 11A of diode portion 11. Active-portion electrode 1A thus functions as an anode electrode of the main body of the diode. Peripheral electrode 1B is a first anode electrode formed in peripheral region 11B of diode portion 11. Peripheral electrode 1B is spaced from active-portion electrode 1A on the side close to second anode electrode 2 relative to active-portion electrode 1A, that is, outside active-portion electrode 1A. In other words, peripheral electrode 1B is formed on first main surface 10A to surround active-portion electrode 1A, as shown in FIG. 1. Peripheral electrode 1B thus functions as a so-called guard ring for securing the breakdown voltage of the diode including active-portion electrode 1A. Second anode electrode 2 is thus spaced from peripheral electrode 1B outside peripheral electrode 1B in plan view.

For the X direction, a first end 1E of first anode electrode 1 on the second anode electrode 2 side, that is, the outer side will now be considered. In the example of FIG. 3 in which first anode electrode 1 includes active-portion electrode 1A and peripheral electrode 1B outside active-portion electrode 1A, first end 1E is an end of peripheral electrode 1B on the second anode electrode 2 side. Also, a second end 2E of second anode electrode 2 on the first anode electrode 1 side, that is, the inner side will now be considered. Herein, first end 1E and second end 2E each include an end surface, as well as a relatively wide range adjacent to the end surface, which is surrounded by the dotted line in FIG. 3. At this time, first end 1E and second end 2E are each covered with a SInSiN film 3. In FIGS. 1 and 3, SInSiN film 3 is formed to join all the surfaces of peripheral electrode 1B including first end 1E other than a surface of peripheral electrode 1B on the semiconductor substrate 10 side, that is, the surface facing downward in the Z direction, to the region of active-portion electrode 1A on the right side in the X direction, which is partial portions of the surfaces of active-portion electrode 1A. In other words, SInSiN film 3 in FIG. 3 straddles active-portion electrode 1A and peripheral electrode 1B so as to contact both of a part of active-portion electrode 1A and a part of peripheral electrode 1B.

SInSiN film 3 is a semi-insulated silicon nitride film. As shown in FIG. 3, SInSiN film 3 may entirely cover first end 1E and second end 2E. SInSiN film 3 may cover only a partial region of at least any of first end 1E and second end 2E. SInSiN film 3 may be formed only in a partial region of a surface of peripheral electrode 1B other than first end 1E, or may not be formed on a surface of peripheral electrode 1B other than first end 1E. SInSiN film 3 may not be formed on the surfaces of active-portion electrode 1A.

In FIG. 3, a third end 2G of second anode electrode 2 opposite to second end 2E in the X direction is covered with SInSiN film 3. Such a configuration may be provided. As in FIG. 3, SInSiN film 3 may entirely cover third end 2G. However, SInSiN film 3 may be formed only at a part of third end 2G. Alternatively, SInSiN film 3 may not be formed at third end 2G.

In FIG. 3, SInSiN film 3 on second end 2E and SInSiN film 3 on third end 2G are formed as separate pieces. This causes a part of the uppermost surface, that is, the central portion of second anode electrode 2 is not covered with SInSiN film 3 to be exposed. A test pin (not shown) for causing second anode electrode 2 to function as a monitoring electrode is placed in a portion in which second anode electrode 2 is exposed.

In the present embodiment, a resin-based insulating film, such as a polyimide film, may be used in place of SInSiN film 3. Alternatively, the film covering at least any of first end 1E and second end 2E may have a double-layer structure having a stack of SInSiN film 3 and the resin-based insulating film such as a polyimide film.

Semiconductor substrate 10 has a first anode region 4 and a second anode region 5 formed on first main surface 10A. First anode region 4 is formed in diode portion 11, and second anode region 5 is formed in monitoring portion 12. First anode region 4 includes a first anode active region 4A and a first anode peripheral region 4B. First anode active region 4A is formed in active region 11A, and first anode peripheral region 4B is formed in peripheral region 11B. First anode active region 4A, first anode peripheral region 4B, and second anode region 5 are formed as p-type impurity regions in n-type semiconductor substrate 10.

First anode active region 4A is formed in at least a partial region of first main surface 10A of active region 11A. First anode peripheral region 4B is formed in at least a partial region of first main surface 10A of peripheral region 11B. Second anode region 5 is formed in at least a partial region of first main surface 10A of monitoring portion 12. As a result, first anode active region 4A overlaps active-portion electrode 1A at least partially in plan view. First anode peripheral region 4B overlaps peripheral electrode 1B at least partially in plan view. Second anode region 5 overlaps second anode electrode 2 at least partially in plan view. Thus, first anode active region 4A is in contact with active-portion electrode 1A, first anode peripheral region 4B is in contact with peripheral electrode 1B, and second anode region 5 is in contact with monitoring portion 12, on first main surface 10A.

Semiconductor substrate 10 has a cathode region 6 formed on second main surface 10B. Cathode region 6 may be formed on almost the entire second main surface 10B in active region 11A, peripheral region 11B, and monitoring portion 12, as shown in FIG. 3. Note that cathode region 6 may be formed only on a part of second main surface 10B of active region 11A. Cathode region 6 is formed in n-type semiconductor substrate 10 as an n-type impurity region having a higher impurity content than that of semiconductor substrate 10.

On the contrary, semiconductor substrate 10 and cathode region 6 may be of p type, and first anode region 4 and second anode region 5 may be of n type.

Semiconductor substrate 10 has a cathode electrode 7 formed on second main surface 10B. Cathode electrode 7 is preferably formed to overlap cathode region 6 in plan view. That is to say, in FIG. 3, since cathode region 6 is formed on the entire second main surface 10B, cathode electrode 7 is formed on the entire second main surface 10B so as to cover the entire cathode region 6. As a result, cathode region 6 is in contact with cathode electrode 7 on second main surface 10B. Cathode electrode 7 is thus electrically connected to cathode region 6.

Further, semiconductor substrate 10 has an oxide film 8 formed on first main surface 10A, as shown in FIG. 3. Oxide film 8 is formed to be in contact with both of first anode active region 4A and first anode peripheral region 4B and straddle these electrodes. Another oxide film 8 is formed to be in contact with both of first anode peripheral region 4B and second anode region 5 and straddle these electrodes. Oxide film 8 is formed to cover only a part of the portion of each of first anode active region 4A, first anode peripheral region 4B, and second anode region 5, which is in contact with first main surface 10A. Thus, the end surface of oxide film 8 in the X direction defines an opening 8A on first main surface 10A in each of first anode active region 4A, first anode peripheral region 4B, and second anode region 5. That is to say, in opening 8A, each of first anode active region 4A, first anode peripheral region 4B, and second anode region 5 is exposed from oxide film 8 so as not to be covered with oxide film 8.

First anode active region 4A is in contact with active-portion electrode 1A through opening 8A of oxide film 8. First anode active region 4A and active-portion electrode 1A are thus electrically connected to each other. Similarly, first anode peripheral region 4B is in contact with peripheral electrode 1B through opening 8A of oxide film 8. First anode peripheral region 4B and peripheral electrode 1B are thus electrically connected to each other. Further, second anode region 5 is in contact with second anode electrode 2 through opening 8A of oxide film 8. Second anode region 5 and second anode electrode 2 are thus electrically connected to each other.

Each of active-portion electrode 1A, peripheral electrode 1B, and second anode electrode 2 is disposed such that a part thereof covers a surface of oxide film 8. More specifically, oxide film 8 straddles active-portion electrode 1A and peripheral electrode 1B so as to be in contact with a part of active-portion electrode 1A and a part of peripheral electrode 1B. Another oxide film 8 straddles peripheral electrode 1B and second anode electrode 2 so as to be in contact with a part of peripheral electrode 1B and a part of second anode electrode 2.

Figure 5:
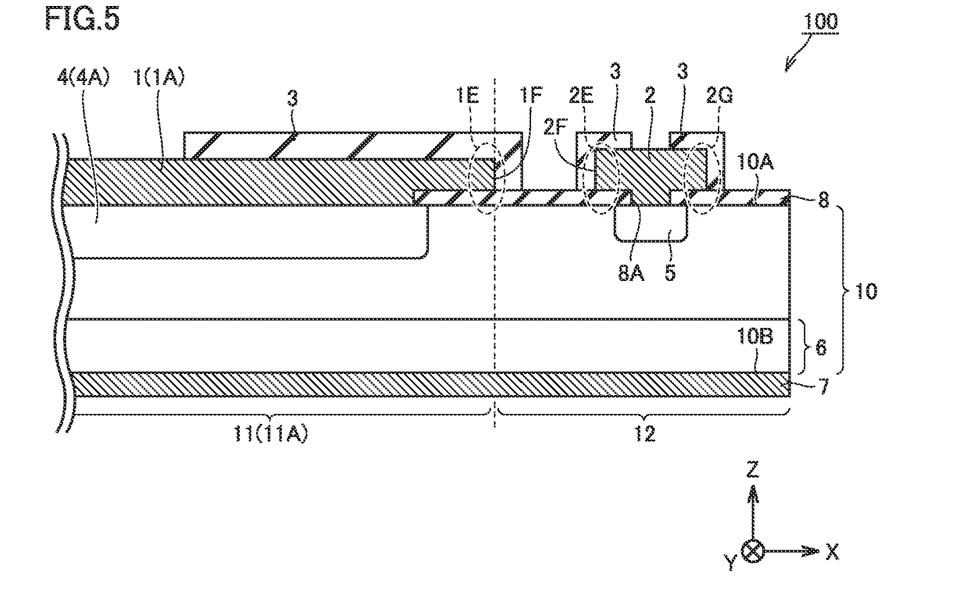
FIG. 5 is a schematic sectional view of a semiconductor device of a second example of Embodiment 1.

FIG. 5 is a schematic sectional view of a semiconductor device of a second example of Embodiment 1. Referring to FIG. 5, a semiconductor device 100 according to the second example of the present embodiment essentially has the same configuration as that of semiconductor device 100 of FIG. 3 according to the first example. Thus, the same components are denoted by the same references, and description thereof will not be repeated unless there is any difference or the like. Note that FIG. 5 is different from FIG. 3 in the configurations of first anode electrode 1 and first anode region 4.

Specifically, in FIG. 5, first anode electrode 1 is not divided into two electrodes, namely, active-portion electrode 1A and peripheral electrode 1B, and includes only active-portion electrode 1A serving as a single first anode electrode 1 including these electrodes of FIG. 3 integrated with each other. Active-portion electrode 1A is formed in the regions in which active-portion electrode 1A and peripheral electrode 1B are disposed and the entire region between these electrodes in FIG. 3. Also, first anode region 4 is not divided into two regions, namely, first anode active region 4A and first anode peripheral region 4B, and includes only first anode active region 4A serving as a single first anode region 4 including these regions of FIG. 3 integrated with each other. First anode active region 4A is formed in the regions in which first anode active region 4A and first anode peripheral region 4B are disposed and the entire region between these regions in FIG. 3. In semiconductor device 100 of FIG. 5, active-portion electrode 1A and peripheral electrode 1B of semiconductor device 100 in FIG. 1 are integrated with each other as active-portion electrode 1A, which serves as a single first anode electrode 1, in a plan view (not shown).

Peripheral electrode 1B in the first example of FIG. 3 is provided for achieving a configuration in which the diode including active-portion electrode 1A has a breakdown voltage of not less than a certain value. However, peripheral electrode 1B serving as a guard ring is not necessary as long as the diode can secure high breakdown voltage. In that case, semiconductor device 100 having the configuration as in the second example shown in FIG. 5 can be assumed as an example of the present embodiment.

Figure 6:
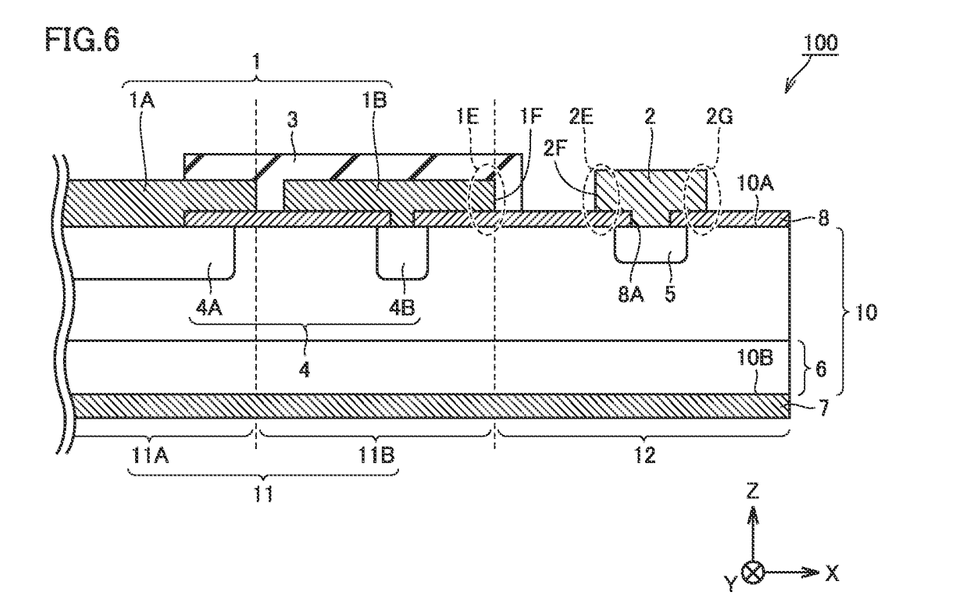
FIG. 6 is a schematic sectional view of a semiconductor device of a third example of Embodiment 1.

FIG. 6 is a schematic sectional view of a semiconductor device of a third example of Embodiment 1. Referring to FIG. 6, a semiconductor device 100 according to the third example of the present embodiment essentially has the same configuration as that of semiconductor device 100 of FIG. 3 according to the first example. Thus, the same components are denoted by the same references, and description thereof will not be repeated unless there is any difference or the like. Note that FIG. 6 is different from FIG. 3 in the configuration of SInSiN film 3.

Specifically, in FIG. 6, SInSiN film 3 similar to that of FIG. 3 is formed only in active-portion electrode 1A and peripheral electrode 1B of first anode electrode 1. SInSiN film 3 is thus formed to cover first end 1E in FIG. 6. In FIG. 6, however, second anode electrode 2 is not covered with SInSiN film 3. Thus, SInSiN film 3 is not formed on second end 2E.

It suffices that in the present embodiment, SInSiN film 3 is formed to cover only at least any of first end 1E and second end 2E. SInSiN film 3 thus may be formed to cover only first end 1E of first anode electrode 1 and not to cover second end 2E of second anode electrode 2, as shown in FIG. 6. In contrast to FIG. 6, in an alternative configuration (not shown), SInSiN film 3 covering second end 2E may be formed only in second anode electrode 2 in a similar manner to that of FIG. 3, and SInSiN film 3 covering first end 1E may not be formed in first anode electrode 1. In another alternative configuration, for example, SInSiN film 3 may be formed at only any of first end 1E and second end 2E in the configuration in which first anode electrode 1 includes only active-portion electrode 1A as in the second example shown in FIG. 5. These configurations are conceivable as further modifications of semiconductor device 100.

In FIGS. 3, 5, and 6, the boundaries between active region 11A, peripheral region 11B, and monitoring portion 12 are indicated by the dotted lines extending in the Z direction.

Note that the position of the dotted line may be changed horizontally somewhat with respect to the position in each of FIGS. 3, 5, and 6. For example, it suffices that the dotted line on the left of each of FIGS. 3 and 6 is disposed at any position between active-portion electrode 1A and peripheral electrode 1B in the X direction. It suffices that the dotted line on the right of each of FIGS. 3 and 6 is disposed at any position between peripheral electrode 1B and second anode electrode 2 in the X direction.

Next, the function and effect of the present embodiment will be described with reference to FIGS. 7A-7D.

Semiconductor device 100 according to the present disclosure includes semiconductor substrate 10, first anode electrode 1, and second anode electrode 2. First anode electrode 1 is disposed on semiconductor substrate 10. Second anode electrode 2 is spaced from first anode electrode 1 on semiconductor substrate 10 around first anode electrode 1. At least any of first end 1E of first anode electrode 1 on the second anode electrode 2 side and second end 2E of second anode electrode 2 on the first anode electrode 1 side is covered with SInSiN film 3.

As semiconductor device 100 is driven, a potential difference occurs between first end 1E of first anode electrode 1 and second end 2E of second anode electrode 2. This results in a state in which an electric discharge may occur between first anode electrode 1 and second anode electrode 2. Semiconductor device 100, however, includes SInSiN film 3 having semi-insulation properties, that is, insulation properties. Semiconductor device 100 can thus have a longer spatial distance and a longer creeping distance, which are insulating distances between first end 1E and second end 2E, than a semiconductor device which does not include SInSiN film 3 but includes the same components as those of semiconductor device 100. Owing to a longer creeping distance as described above, semiconductor device 100 can restrain an electric discharge between first anode electrode 1 including first end 1E and second anode electrode 2 including second end 2E.

Figure 7A:
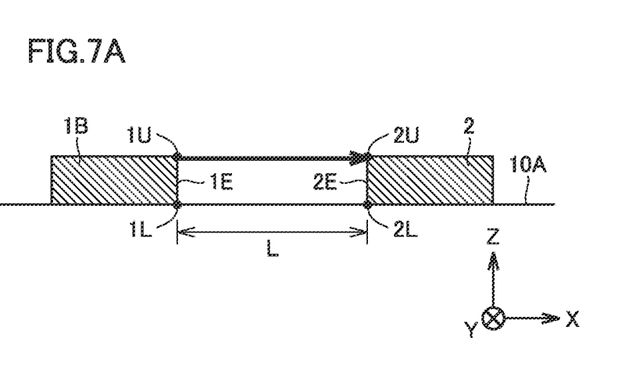
FIGS. 7A-7D show schematic views for explaining the function and effect of the semiconductor device of Embodiment 1.
Figure 7B:
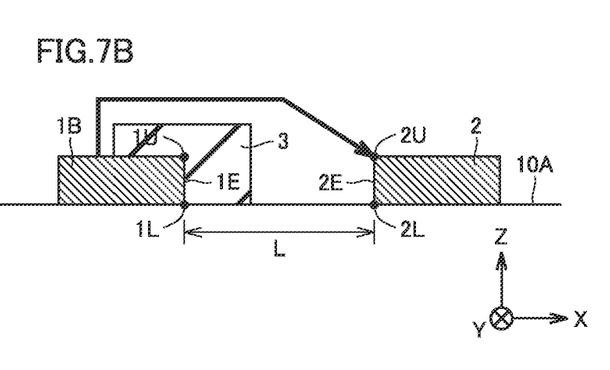
Figure 7C:
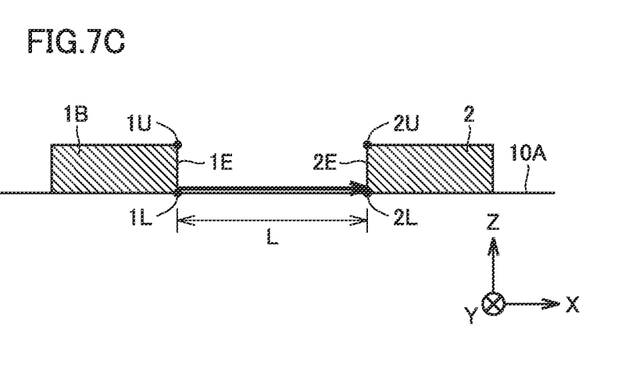

FIGS. 7A-7D show schematic views for explaining the function and effect of the semiconductor device of Embodiment 1. Referring to FIGS. 7A-7D, FIG. 7B and FIG. 7D each show a part taken out from a region on first main surface 10A of semiconductor device 100 of FIG. 6. On the other hand, FIG. 7A shows a comparative example and is different from FIG. 7B in that SInSiN film 3 is not formed but is similar to FIG. 7B in other respects. Also, FIG. 7C shows a comparative example and is different from FIG. 7D in that SInSiN film 3 is not formed but is similar to FIG. 7D in other respects. In each of FIGS. 7A-7D, oxide film 8, first anode region 4, and second anode region 5 are not shown. In each view of FIGS. 7A-7D, a distance between peripheral electrode 1B and second anode electrode 2 which extends in the X direction is denoted by L.

In the comparative example of FIG. 7A in which SInSiN film 3 is not provided, the spatial distance that is the insulation distance between peripheral electrode 1B and second anode electrode 2 is equal to a distance L between an uppermost point 1U of first end 1E and an uppermost point 2U of second end 2E. Contrastingly, in the third example of the present embodiment shown in FIG. 7B, the creeping distance that is the insulating distance between peripheral electrode 1B and second anode electrode 2 is larger than distance L, as indicated by the arrow in FIG. 7B. The creeping distance in FIG. 7B extends along the surface of SInSiN film 3 and is larger than the spatial distance in FIG. 7A by an amount by which the creeping distance extends beyond SInSiN film 3.

In the comparative example of FIG. 7C in which SInSiN film 3 is not provided, as in the above comparative example, a spatial distance that is an insulating distance between peripheral electrode 1B and second anode electrode 2 is equal to distance L between a lowermost point 1L of first end 1E and a lowermost point 2L of second end 2E, as indicated by the arrow in FIG. 7C. Contrastingly, in FIG. 7D which shows one mode of the present embodiment, the creeping distance between peripheral electrode 1B and second anode electrode 2 is larger than distance L, as indicated by the arrow in FIG. 7D. The creeping distance in FIG. 7D extends along the surface of SInSiN film 3 and is larger than the spatial distance in FIG. 7C by an amount by which the creeping distance needs to extend beyond SInSiN film 3.

Figure 7D:
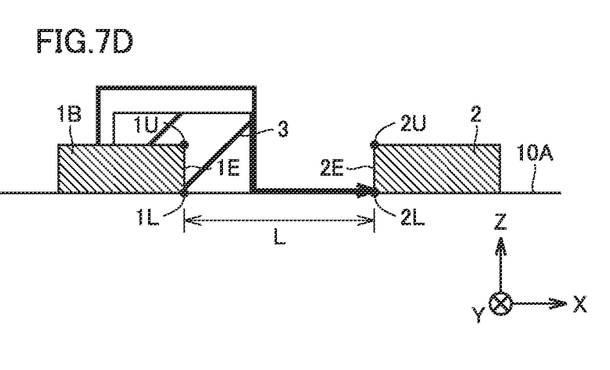

Although the third example of FIG. 6 is cited in FIGS. 7A-7D, for example, the creeping distance is larger in the first example of FIG. 3 than those of FIG. 7B and FIG. 7D. This is because SInSiN film 3 is formed at first end 1E of first anode electrode 1, as well as second end 2E of second anode electrode 2 serving as a monitoring electrode.

Semiconductor device 100 according to the present disclosure may include a resin-based insulating film, such as a polyimide film, in place of SInSiN film 3. That is to say, semiconductor device 100 described above includes semiconductor substrate 10, first anode electrode 1, and second anode electrode 2. First anode electrode 1 is disposed on semiconductor substrate 10. Second anode electrode 2 is spaced from first anode electrode 1 on semiconductor substrate 10 around first anode electrode 1. At least any of first end 1E of first anode electrode 1 on the second anode electrode 2 side and second end 2E of second anode electrode 2 on the first anode electrode 1 side is covered with the resin-based insulating film such as a polyimide film. The function and effect in this case are similar to those described above, description of which will not be repeated.

In semiconductor device 100, first anode electrode 1 on semiconductor substrate 10 includes active-portion electrode 1A and peripheral electrode 1B. Peripheral electrode 1B is spaced from active-portion electrode 1A on the second anode electrode 2 side of active-portion electrode 1A. First end 1E is an end of peripheral electrode 1B on the second anode electrode 2 side. Such a configuration is more preferred. This structure causes peripheral electrode 1B to function as a guard ring, thus securing high breakdown voltage of the diode.

In semiconductor device 100, SInSiN film 3 is formed to join at least a part of a surface of active-portion electrode 1A to surfaces of peripheral electrode 1B including first end 1E other than a surface of peripheral electrode 1B facing the semiconductor substrate 10 side. Such a configuration is more preferred. Herein, SInSiN film 3 is more preferably formed to join at least a part of the surface of active-portion electrode 1A to all the surfaces of peripheral electrode 1B including first end 1E other than the surface of peripheral electrode 1B facing the semiconductor substrate 10 side. That is to say, in this case, SInSiN film 3 is formed to straddle active-portion electrode 1A and peripheral electrode 1B in first anode electrode 1. This can restrain active-portion electrode 1A and peripheral electrode 1B from being crushed and connected to each other to be short-circuited due to a stress applied from above in the Z direction in, for example, mounting of semiconductor device 100 in a package. This can also restrain an electric discharge between active-portion electrode 1A and peripheral electrode 1B.

For example, in FIG. 3 or 5, SInSiN film 3 covering first anode electrode 1 and SInSiN film 3 covering second anode electrode 2 may be integrally formed. That is to say, SInSiN film 3 may be formed to straddle first anode electrode 1 and second anode electrode 2.

Embodiment 2

Figure 8:
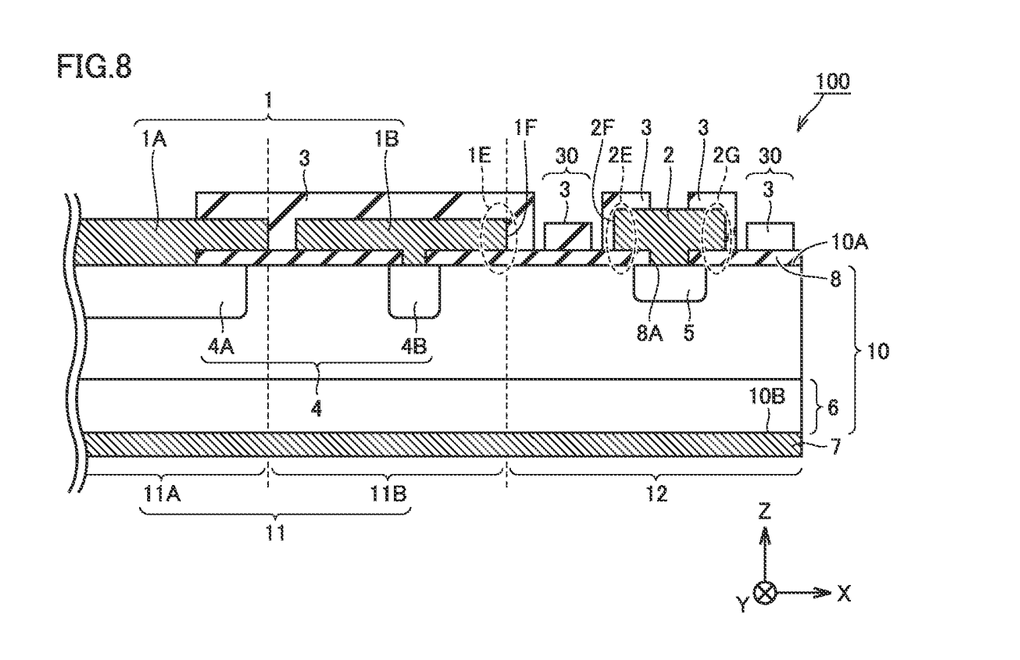
FIG. 8 is a schematic sectional view of a semiconductor device of Embodiment 2.

FIG. 8 is a schematic sectional view of a semiconductor device of Embodiment 2. Referring to FIG. 8, a semiconductor device 100 according to the present embodiment essentially has the same configuration as that of semiconductor device 100 of FIG. 3 according to each example, for example, the first example of Embodiment 1. Thus, the same components are denoted by the same references, and description thereof will not be repeated unless there is any difference or the like. Note that FIG. 8 is different from FIG. 3 in that a projection structure 30 is further provided.

Specifically, semiconductor device 100 of FIG. 8 includes projection structure 30 on semiconductor substrate 10, that is, on first main surface 10A. Projection structure 30 is formed between peripheral electrode 1B of first anode electrode 1 and second anode electrode 2 on first main surface 10A and formed on the opposite side of second anode electrode 2 from first anode electrode 1. More specifically, projection structure 30 is formed between SInSiN film 3 covering first end 1E of peripheral electrode 1B and SInSiN film 3 covering second end 2E of second anode electrode 2 while being spaced from SInSiN film 3. Also, projection structure 30 is formed adjacent to SInSiN film 3 covering third end 2G of second anode electrode 2 in the X direction while being spaced from SInSiN film 3. Note that projection structure 30 may be formed only between peripheral electrode 1B and second anode electrode 2.

Projection structure 30 has a shape of a column extending upward from first main surface 10A in the Z direction. Projection structure 30 is formed of SInSiN film 3. SInSiN film 3 of projection structure 30 may be formed as the same layer as or a different layer from SInSiN film 3 covering first anode electrode 1 and second anode electrode 2. When SInSiN film 3 of projection structure 30 is the same layer as SInSiN film 3 covering first anode electrode 1 or the like, projection structure 30 has a dimension in the Z direction which is substantially the same as the thickness of SInSiN film 3 covering first anode electrode 1 or the like. Projection structure 30 of the present embodiment may thus have a dimension in the Z direction which is smaller than that of the structure in which SInSiN film 3 is formed on first anode electrode 1 and second anode electrode 2.

Also in the present embodiment, as in Embodiment 1, the resin-based insulating film such as a polyimide film may be used in place of SInSiN film 3. Alternatively, SInSiN film 3, the polyimide film, and/or the like may be stacked.

Next, the function and effect of the present embodiment will be described. Semiconductor device 100 according to the present disclosure achieves the following function and effect in addition to the function and effect similar to those of semiconductor device 100 of Embodiment 1.

Semiconductor device 100 according to the present disclosure further includes projection structure 30 including SInSiN film 3 between first anode electrode 1 and second anode electrode 2 on semiconductor substrate 10. Projection structure 30 can further enhance the effect of restraining an electric discharge between first anode electrode 1 and second anode electrode 2 than in the case in which projection structure 30 is not provided. This is because the creeping distance between first anode electrode 1 and second anode electrode 2 is larger than that of Embodiment 1 by an amount of the length of the outer edge of projection structure 30.

Embodiment 3

Figure 9:
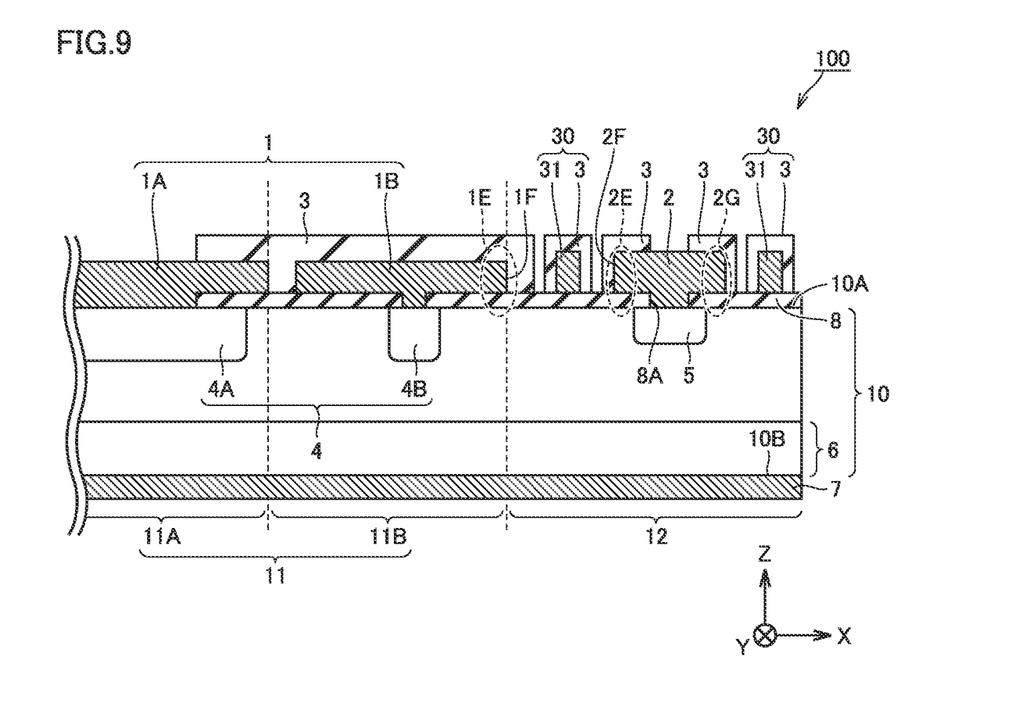
FIG. 9 is a schematic sectional view of a semiconductor device of a first example of Embodiment 3.

FIG. 9 is a schematic sectional view of a semiconductor device of a first example of Embodiment 3. Referring to FIG. 9, a semiconductor device 100 according to the present embodiment essentially has the same configuration as that of semiconductor device 100 of FIG. 8 according to Embodiment 2. Thus, the same components are denoted by the same references, and description thereof will not be repeated unless there is any difference or the like. Note that FIG. 9 is different from FIG. 8 in the configuration of projection structure 30.

Specifically, in the present embodiment, projection structure 30 includes SInSiN film 3 and an additional material portion 31 made of any material other than that of SInSiN film 3. Projection structure 30 has a double-layer structure having a stack of SInSiN film 3 and additional material portion 31. Projection structure 30 may have a structure formed of three or more layers.

In projection structure 30 of FIG. 9, additional material portion 31 is formed as a lower layer, and SInSiN film 3 having, for example, semi-insulation properties is formed as an upper layer so as to cover the surface of additional material portion 31. Additional material portion 31 may thus be formed as the same layer as first anode electrode 1 and second anode electrode 2 and made of the same conductive material as those of these electrodes. Alternatively, additional material portion 31 may be formed as a thin film that is a layer different from each of the electrodes. In that case, projection structure 30 is formed by forming SInSiN film 3 so as to cover the surfaces of additional material portion 31 other than the surface of additional material portion 31 facing the semiconductor substrate 10 side, namely, facing downward. SInSiN film 3 is preferably formed so as to cover all the surfaces of additional material portion 31 other than the surface of additional material portion 31 facing downward.

Figure 10:
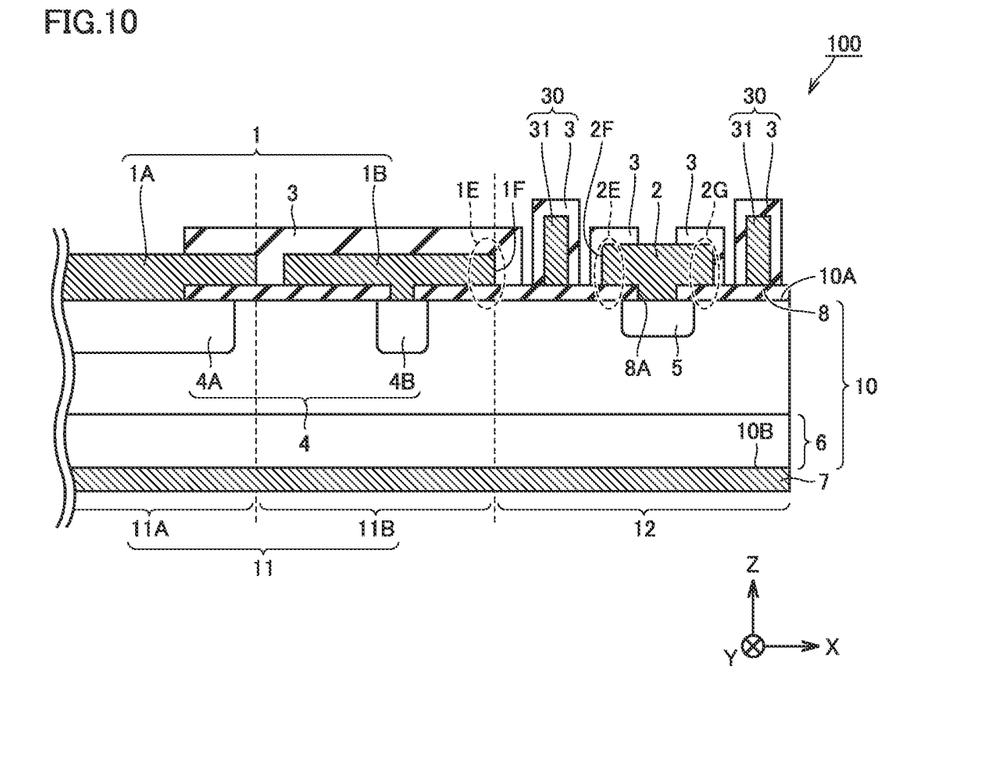
FIG. 10 is a schematic sectional view of a semiconductor device of a second example of Embodiment 3.

FIG. 10 is a schematic sectional view of a semiconductor device of a second example of Embodiment 3. Referring to FIG. 10, a semiconductor device 100 according to the second example of the present embodiment essentially has the same configuration as that of semiconductor device 100 of FIG. 9 according to the first example. Thus, the same components are denoted by the same references, and description thereof will not be repeated unless there is any difference or the like. Note that FIG. 10 is different from FIG. 9 in the dimension of projection structure 30 in the Z direction.

Specifically, in FIG. 9, the dimension of the entire projection structure 30 in the Z direction which includes SInSiN film 3 and additional material portion 31 is nearly the same as the dimension of a portion in the Z direction which includes first anode electrode 1 and SInSiN film 3 formed on first anode electrode 1. Contrastingly, in FIG. 10, the dimension of the entire projection structure 30 in the Z direction which includes SInSiN film 3 and additional material portion 31 is larger than the dimension of the portion in the Z direction which includes first anode electrode 1 and SInSiN film 3 formed on first anode electrode 1. In FIG. 10, the dimension of additional material portion 31 of projection structure 30 in the Z direction is larger than the dimension of the portion in the Z direction which includes first anode electrode 1 and SInSiN film 3 formed on first anode electrode 1.

Also in the present embodiment, the resin-based insulating film such as a polyimide film may be used in place of SInSiN film 3, and SInSiN film 3, the polyimide film, and/or the like may be stacked, as in Embodiments 1 and 2. The configuration of each example of the present embodiment may be combined with the feature of each example of Embodiment 1.

Next, the function and effect of the present embodiment will be described. Semiconductor device 100 according to the present disclosure achieves the following function and effect in addition to the function and effect similar to those of semiconductor devices 100 of Embodiments 1 and 2.

In semiconductor device 100 according to the present disclosure, projection structure 30 described above includes SInSiN film 3 and additional material portion 31 disposed inside SInSiN film 3 and made of a material other than that of SInSiN film 3. As described above, projection structure 30 of semiconductor device 100 of the present embodiment has the structure composed of a plurality of layers. This results in a dimension in the Z direction which is larger than that of, for example, projection structure 30 having a single-layer structure including only SInSiN film 3 as in Embodiment 2. Consequently, the creeping distance between first anode electrode 1 and second anode electrode 2 can be larger than in Embodiment 2 in which projection structure 30 is included. Thus, the effect of restraining an electric discharge between first anode electrode 1 and second anode electrode 2 can be enhanced further than in Embodiment 2.

When the dimension of projection structure 30 in the Z direction is larger as in FIG. 10, the creeping distance between first anode electrode 1 and second anode electrode 2 can be larger owing to projection structure 30. This leads to a further enhanced effect of restraining an electric discharge between first anode electrode 1 and second anode electrode 2 than in FIG. 9.

Embodiment 4

Figure 11:
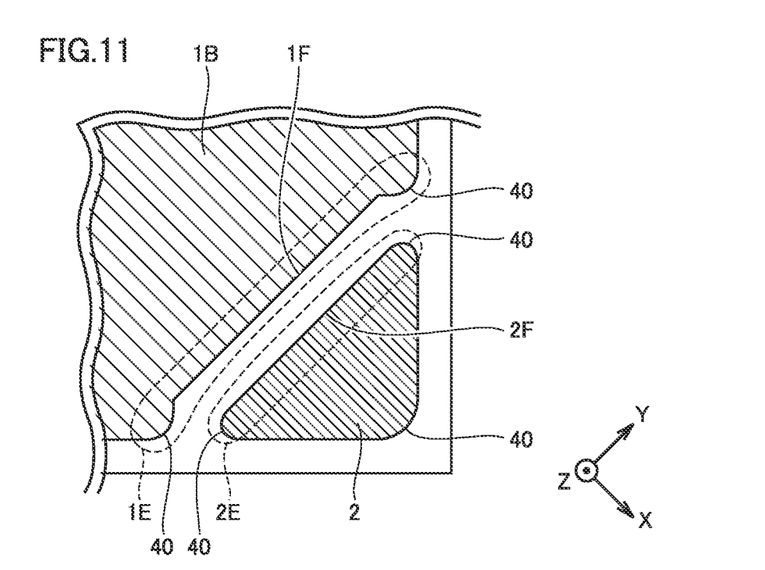
FIG. 11 is an enlarged schematic top view of the same region as that of FIG. 4 in Embodiment 4.

FIG. 11 is an enlarged schematic top view of the same region as that of FIG. 4 in Embodiment 4. Referring to FIG. 11, a semiconductor device 100 according to the present embodiment essentially has the same configuration as that of semiconductor device 100 of the first example of Embodiment 1. Thus, the same components are denoted by the same references, and description thereof will not be repeated unless there is any difference or the like. Note that FIG. 11 is different from FIG. 4 in the planar shapes of peripheral electrode 1B of first anode electrode 1 and second anode electrode 2.

Specifically, a first end surface 1F is considered here that is a part of first end 1E of peripheral electrode 1B and is a surface directly facing second end 2E of second anode electrode 2. Also, a second end surface 2F is considered here that is a part of second end 2E of second anode electrode 2 and is a surface directly facing first end 1E of peripheral electrode 1B. In FIG. 11, a chamfered portion 40 is formed at each of corners of first end surface 1F and second end surface 2F.

Figure 12:
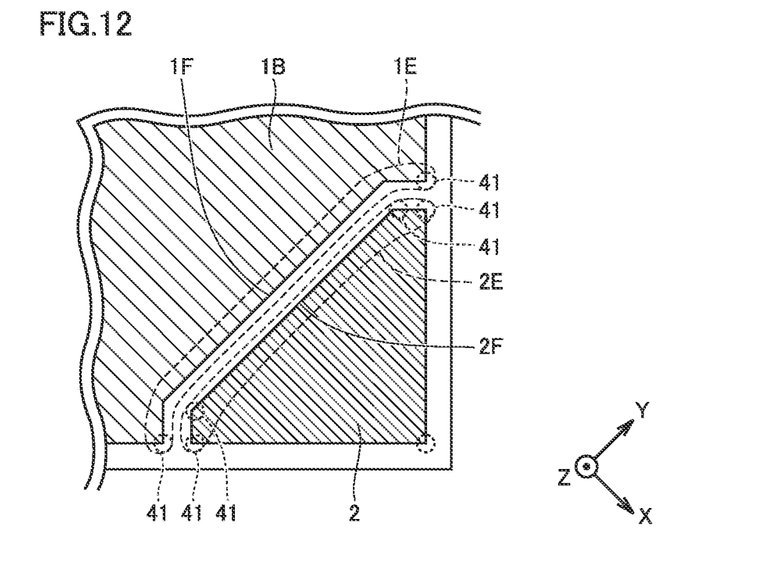
FIG. 12 is an enlarged schematic top view of corners of a first end surface and a second end surface in the same region as that of FIG. 11.

FIG. 12 is a schematic enlarged top view of corners of a first end surface and a second end surface in the same region as that of FIG. 11. Referring to FIG. 12, corners 41 are portions at which first end surface 1F and second end surface 2F are bent in a projecting manner at the end in the direction in which first end surface 1F and second end surface 2F extend, as seen from outside. In FIG. 12, thus, two corners 41 are formed in peripheral electrode 1B, and four corners 41 are formed in second anode electrode 2. The angle formed by corner 41 may be, for example, a right angle or an obtuse angle larger than a right angle. Corners 41 are chamfered such that first end surface 1F and second end surface 2F, which originally have a planar surface shape, have a curved surface shape, particularly have an arc shape in plan view, for example. Consequently, corners 41 of FIG. 12 are shaped into chamfered portions 40 of FIG. 11.

In FIG. 11, curved surfaces are formed in all of corners 41 of FIG. 12 to form chamfered portions 40. However, curved surfaces may be formed only in some of corners 41 of FIG. 12 to form chamfered portions 40.

When chamfered portion 40 has, for example, an arc shape in plan view, first anode electrode 1 has a larger radius of the arc shape than second anode electrode 2. Note that first anode electrode 1 and second anode electrode 2 may have an nearly equal radius of the arc shape, or second anode electrode 2 may have a radius of the arc shape larger than first anode electrode 1.

Also in the present embodiment, the resin-based insulating film such as a polyimide film may be used in place of SInSiN film 3. The configuration of each example of the present embodiment may be combined with the feature of each example of Embodiments 1 to 3.

Next, the function and effect of the present embodiment will be described. Semiconductor device 100 according to the present disclosure achieves the following function and effect in addition to the function and effect similar to those of semiconductor devices 100 of Embodiments 1 to 3.

In semiconductor device 100 according to the present disclosure, chamfered portion 40 is formed in each of corner 41 of first end surface 1F of first end 1E facing second end 2E and corner 41 of second end surface 2F of second end 2E facing first end 1E. Chamfered portion 40 of FIG. 11 can restrain electric field concentration in peripheral electrode 1B and second anode electrode 2 more than, for example, corner 41 of FIG. 12. This allows chamfered portion 40 to restrain an electric discharge between first end surface 1F and second end surface 2F more than corner 41.

The features described in (the examples of) the respective embodiments described above may be applied in appropriate combination within the range where technical inconsistency does not occur.

Although the embodiments of the present disclosure have been described, it should be understood that the embodiments disclosed herein are illustrative and non-restrictive in every respect. The scope of the present disclosure is defined by the scope of the claims, and is intended to include any modifications within the scope and meaning equivalent to the scope of the claims.

What is claimed is:
1. A semiconductor device comprising:
   a semiconductor substrate;
   a first anode electrode disposed on the semiconductor substrate; and
   a second anode electrode spaced from the first anode electrode on the semiconductor substrate around the first anode electrode,
   wherein at least any of a first end of the first anode electrode on a second anode electrode side and a second end of the second anode electrode on a first anode electrode side is covered with a SInSiN film.
2. The semiconductor device according to claim 1, wherein
   the first anode electrode on the semiconductor substrate includes
      an active-portion electrode, and a peripheral electrode spaced from the active-portion electrode on the second anode electrode side of the active-portion electrode, and the first end is an end of the peripheral electrode on the second anode electrode side.

3. The semiconductor device according to claim 2, wherein the SInSiN film is formed to join at least a part of a surface of the active-portion electrode to surfaces of the peripheral electrode including the first end other than a surface of the peripheral electrode facing a semiconductor substrate side.

4. The semiconductor device according to claim 1, further comprising a projection structure including the SInSiN film between the first anode electrode and the second anode electrode on the semiconductor substrate.

5. The semiconductor device according to claim 4, wherein the projection structure includes
the SInSiN film, and
an additional material portion disposed inside the SInSiN film and made of a material other than a material of the SInSiN film.

6. The semiconductor device according to claim 1, wherein a chamfered portion is formed at a corner of a first end surface of the first end facing the second end and a corner of a second end surface of the second end facing the first end.

7. The semiconductor device according to claim 1, wherein at least any of the first end of the first anode electrode on the second anode electrode side and the second end of the second anode electrode on the first anode electrode side is covered with the SInSiN film so as to increase a creeping distance between the first anode electrode and the second anode electrode.

8. The semiconductor device according to claim 1, wherein at least any of:

the first end and a first adjacent upper surface of the first anode electrode, the first end being an end surface of the first anode electrode closest to the second anode electrode on the second anode electrode side, and the second end and a second adjacent upper surface of the second anode electrode, the second end being an end surface of the second anode electrode closest to the first anode electrode on the first anode electrode side, is covered with the SInSiN film.

9. The semiconductor device according to claim 1, wherein the second anode electrode is spaced from the first anode electrode via an oxide film positioned between the first anode electrode and the second anode electrode.

* * * * *